United States Patent [19]

See et al.

[11] Patent Number: 5,279,978
[45] Date of Patent: Jan. 18, 1994

[54] PROCESS FOR MAKING BICMOS DEVICE HAVING AN SOI SUBSTRATE

[75] Inventors: Yee-Chaung See; Thomas C. Mele; John R. Alvis, all of Austin, Tex.

[73] Assignee: Motorola, Schaumburg, Ill.

[21] Appl. No.: 993,282

[22] Filed: Dec. 18, 1992

Related U.S. Application Data

[62] Division of Ser. No. 566,901, Aug. 13, 1990, Pat. No. 5,212,397.

[51] Int. Cl.$^5$ .............................................. H01L 21/265
[52] U.S. Cl. ......................................... 437/34; 437/21; 437/59; 437/62; 148/DIG. 9
[58] Field of Search ..................... 437/34, 59, 21, 920, 437/62, 26, 56, 57, 67, 68; 148/DIG. 9

[56] References Cited

U.S. PATENT DOCUMENTS

| | | | |
|---|---|---|---|
| 4,908,328 | 3/1990 | Hu et al. | 148/DIG. 12 |
| 4,931,407 | 6/1990 | Maeda et al. | 437/45 |
| 4,951,102 | 8/1990 | Beitman et al. | 357/23.4 |
| 4,962,051 | 10/1990 | Liaw | 437/26 |
| 4,975,126 | 12/1990 | Margail et al. | 437/26 |
| 5,013,681 | 5/1991 | Godbey et al. | 437/26 |
| 5,196,355 | 3/1993 | Wittkower | 437/62 |

FOREIGN PATENT DOCUMENTS 56-125868 10/1981 Japan .

Primary Examiner—Brian E. Hearn
Assistant Examiner—Tuan Nguyen
Attorney, Agent, or Firm—Jasper W. Dockrey

[57] ABSTRACT

A BiCMOS device and process are disclosed wherein the transistors components are fabricated on an SOI substrate. A SIMOX process is used to form a buried oxide layer in a single crystal silicon substrate followed by an epitaxial deposition to form a silicon body of varying thickness overlying the buried oxide layer. MOS transistors are then formed in a thin portion of the epitaxial layer and a vertical bipolar transistor is formed in the thick portion of the epitaxial layer.

In accordance with one embodiment of the invention, a single crystal semiconductor substrate is provided having a principal surface and a buried oxide layer underlying the first surface. A lightly doped epitaxial layer of a first conductivity type having a thin MOS region and a thick bipolar region overlies the principal surface. A first and second isolation regions extending from the first surface to the buried oxide layer separate and electrically insulate the bipolar region from the MOS region. An NMOS and a PMOS transistor are formed in the thin MOS region and are separated by a third isolation region extending from the first surface to the buried oxide layer. A vertical bipolar is formed in the electrically insulated bipolar region of the epitaxial layer.

10 Claims, 6 Drawing Sheets

PROCESS FOR MAKING BICMOS DEVICE HAVING AN SOI SUBSTRATE

This is a divisional of application Ser. No. 07/566,901, filed Aug. 13, 1990 now U.S. Pat. No. 5,212,397.

BACKGROUND OF THE INVENTION

This invention relates in general to a semiconductor device and a method for its fabrication, and more particularly to a BiCMOS device on a silicon-on-insulator (SOI) substrate and method of fabrication.

In BiCMOS integrated circuit technology a continuing goal is to fabricate high performance integrated circuits having improved functionally. A common approach to achieving this goal is to reduce the size and separation distance of the various circuit components and thereby increase the packing density. A requirement for electrical isolation of the various circuit components while simultaneously controlling the amount of parasitic capacitance within the circuit presents an obstacle to a simple size reduction of the circuit components. For example, heavily doped PN junctions, in addition to having a large intrinsic capacitance, can also generate a large parasitic capacitance arising from the overlap of their associated depletion regions when the junctions are brought into close proximity to each other. The high intrinsic capacitance, which and proximity induced parasitic capacitance slow the signal transmission rate and switching speed of the circuit. In the bipolar portion, the excessive collector-substrate capacitance slows the switching speed of vertical bipolar transistors commonly used in both bipolar and BiCMOS circuits. The parasitic capacitance problem is particularly acute in the CMOS device portion which has both NMOS and PMOS transistors in close proximity to one another. Typically, a well region of one conductivity type is formed in a single crystal silicon substrate of an opposite conductivity type to provide an electrically isolated region in which to construct one of the CMOS transistors. Although effective, the formation of a well region sets a minimum separation distance for the two transistors. A better solution is to simply isolate the transistors with an oxide isolation structure.

It has been recognized that improved CMOS device performance and increased packing density can be obtained by fabricating the CMOS transistors on an SOI substrate. Using such a substrate eliminates the need to form a well region; therefore, the minimum separation distance can be reduced. The performance characteristics of CMOS devices on an SOI substrate include: improved subthreshold slope, reduced short channel effects, reduced electric field strength, increased transconductance, and better immunity to soft errors. Recent advances in SIMOX (Separation by Implanted Oxygen) technology have reduced the defect density and improved the interface characteristics of SOI substrates formed using a SIMOX process making this technique attractive for SOI substrate formation. Given the improved CMOS performance obtainable with an SOI substrate and the potential for reduced bipolar collector capacitance, it would be advantageous if a BiCMOS device existed having an SOI substrate formed with a SIMOX process.

BRIEF SUMMARY OF THE INVENTION

In practicing the present invention there is provided a BiCMOS device and process wherein CMOS transistors and a vertical bipolar transistor are formed on an SOI substrate. In accordance with one embodiment of the invention, an SOI structure having a principal surface is formed wherein the SOI structure includes a first SOI region having a buried oxide layer in the substrate in close proximity to the principal surface and a second SOI region in which the buried oxide layer is removed from the principal surface. A first isolation region extends from the principal surface to the buried oxide layer separating and electrically isolating the first SOI region from the second SOI region. An NMOS and a PMOS transistor are formed in the first SOI region and are separated by a second isolation region extending from the principal surface of the SOI structure to the surface of the buried oxide layer. A vertical bipolar transistor is formed in the second SOI region.

It will be appreciated that in FIGURES the proportions of the various elements are not to scale. For example, the dimensions of some of the elements are exaggerated relative to each other for clarity.

DETAILED DESCRIPTION OF THE PREFERRED EMBODIMENTS

Various aspects of the invention will now be described in detail with reference to the FIGURES. An example of one possible BiCMOS device 20 fabricated in accordance with the invention is illustrated, in cross section, in FIG. 1. BiCMOS device 20 includes an SOI substrate having a buried oxide layer 22 overlying a single-crystal silicon substrate 24. An epitaxial layer 26, having a first active device region 28 and a second active device 30, overlies buried oxide layer 22. Buried oxide layer 22 is coextensive with substrate 24 and electrically isolates epitaxial layer 26 from substrate 24. Second active device region 30 is further electrically isolated from first active device region 28 by an isolation region 32 surrounding second active device region 30 which extends through epitaxial layer 26 to buried oxide layer 22. A CMOS device comprising an NMOS transistor 36 and a PMOS transistor 38 is formed in second active device region 30. NMOS transistor 36 is separated from second active device region 30 by isolation region 32 and from PMOS transistor 38 by an isolation region 40. In one embodiment, epitaxial layer 26 is lightly doped N-type material although during fabrication, several doping steps are carried out to form heavily doped N+ and P+ regions in epitaxial layer 26. Alternatively, epitaxial layer 26 can be deposited as intrinsic silicon and later doped to have a predetermined impurity concentration. NMOS transistor 36 includes heavily doped N-type source and drain regions 42 and 44 and a gate electrode structure 46 which overlies a thin gate dielectric 47. PMOS transistor 38 includes heavily doped P-type source and drain regions 48 and 50 and a gate electrode structure 52 which overlies a thin gate dielectric 53. A vertical bipolar transistor 54 is formed in first active device region 28. Bipolar transistor 54 includes a buried collector 56, a collector contact 58 extending from the surface of first active device region 28 to buried collector 56, a base region 60 and an emitter region 62. Base region 60 and emitter region 62 are separated from collector contact 58 by a fourth isolation region 63. A base electrode 64 overlies a perimeter portion of base region 60 and is separated from an emitter electrode 66 by an intermediate isolation layer 65.

Figure 1:
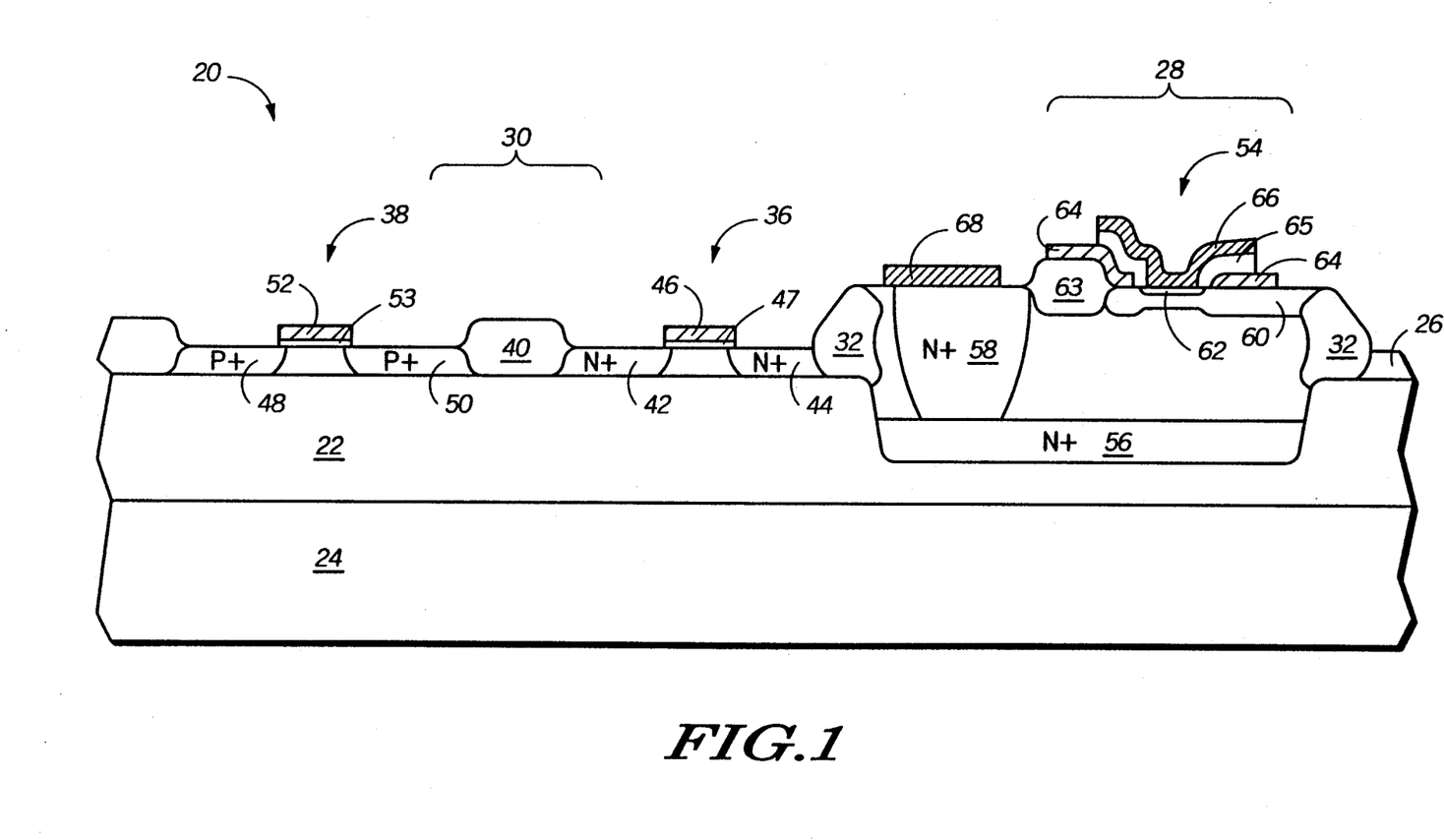
FIG. 1 illustrates, in cross section, a BiCMOS device according to one embodiment of the invention.

Those skilled in the art will recognize that other configurations are possible in the construction of bipolar transistor 54. For example, collector contact 58 can be separated from base electrode 64 simply by a bare portion of first active device region 28. Alternatively, electrical isolation between base electrode 64 and collector contact 58 and collector electrode 68 can be obtained by forming silicon oxide sidewall spacers on base electrode 64. Furthermore, a single poly layer can be used to form electrodes in a non-self aligned base-emitter construction in accordance with the prior art. It is to be noted that the present invention contemplates all such component arrangements for the fabrication of a vertical bipolar transistor in first active device region 28. Further, it is to be understood that many such transistors both MOS and bipolar are included in a complex BiCMOS integrated circuit and that both NPN and PNP transistors can be used. Additionally, the particular arrangement of the transistors shown in FIG. 1 is only one example of a possible arrangement and that other arrangements can be fabricated without departing from the invention. Moreover, the spatial arrangement and particular construction of the components of bipolar transistor 54 can be different from that shown in FIG. 1. For example, collector contact 58 and the emitter and base regions 62 and 60 can be located on the opposite sides of isolation region 63 from that shown in FIG. 1. Also, in cases where both NPN and PNP transistors are used, for example in a complementary BiCMOS device, a separate epitaxial region is used for each bipolar transistor.

The structure shown in FIG. 1 illustrates one example of a BiCMOS device having electrically isolated transistor components fabricated on a silicon-on insulator (SOI) substrate. The fabrication of the MOS and bipolar transistors in an epitaxial layer overlying an insulation material improves the performance of the BiCMOS device by both reducing parasitic capacitance and by permitting component transistors to be placed close together. The fabrication of the buried collector over an insulating layer reduces the parasitic collector-substrate capacitance which improves switching speed of the bipolar transistor. A considerable parasitic capacitance can develop in collector structures fabricated on bulk silicon substrates where a large space charge region forms between the heavily doped buried collector and the lightly doped silicon substrate. The CMOS device performance is improved because the underlying insulating layer eliminates the need for a doped well region, which is both a source of parasitic capacitance and increases the amount of substrate area need for the MOS transistors. Furthermore, a doped channel stop region under the isolation regions, which can be a source of parasitic capacitance, is not necessary when the isolation regions are fabricated in a thin epitaxial layer over an insulating layer. Additionally, the oxide isolation regions can be formed using a shorter oxidation time than similar isolation regions formed in bulk silicon. The shorter oxidation time reduces the amount of lateral oxidation (or "bird's beak") resulting in the formation of less extensive isolation regions. The MOS devices can therefore be placed close together to achieve a high packing density. The elimination of isolation-related doped regions in the substrate reduces parasitic capacitance in the MOS transistor region and the accompanying reduction in exposure to high temperature dopant drive and oxidation cycles preserves the integrity of the buried collector region. Thus, improved drive current and high capacitance drive capability are attained by the fabrication of active transistors on an SOI substrate.

In the BiCMOS fabrication processes of the prior art, a considerable amount of dopant out-diffusion from the buried collector occurs during the thermal drive cycle used to form the well region in the MOS portion of the substrate. This lateral out-diffusion increases the area of the buried collector and reduces the doping concentration in the buried collector region. The lateral diffusion of dopants in the buried collector slows the switching speed of the bipolar transistor by increasing both the collector-base capacitance and the collector resistance. The present invention avoids this problem by forming buried oxide layer 22 below the epitaxial layer by the ion implantation of oxygen through the epitaxial layer. Selected regions of the epitaxial layer are then further electrically isolated by the formation of isolation regions in the epitaxial layer itself. The formation of an SOI substrate employed in the BiCMOS device of the present invention will now be described according to various process embodiments.

PROCESS EMBODIMENT I

Figure 2:
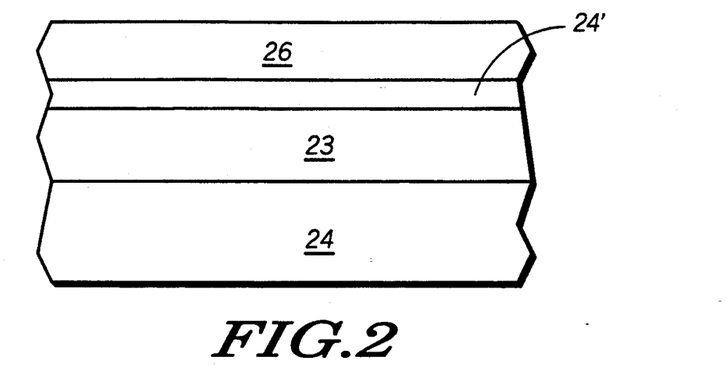
FIG. 2 through 7 illustrate, in cross section, process steps in accordance with a first embodiment for the fabrication of an SOI substrate.

In a first embodiment, buried oxide layer 22 is formed in substrate 24 by two successive oxygen ion implantation steps using a SIMOX process. In the first SIMOX step, illustrated in FIG. 2, about $10^{17}$–$10^{18}$ oxygen ions per square centimeter are implanted into substrate 24 at about 140 to 250 KeV. During the oxygen implantation step substrate 24 is maintained at a temperature of about 600° C. Following oxygen implantation, substrate 24 is annealed at about 1275° C. for about 16 hours. The annealing step repairs the damage to the crystal lattice in the silicon substrate caused by the impact of energetic oxygen ions. The oxygen implant introduces oxygen atoms to substrate 24 having a peak concentration at a depth of about 400 nanometers from the surface of substrate 24. The anneal cycle forms a first oxygenated region 23 about 100 to 250 nanometers below the surface of substrate 24 having thickness of about 300 to 400 nanometers. A thin portion 24' of substrate 24 above the oxygenated region provides a nucleation site for the epitaxial deposition of epitaxial layer 26. The epitaxial deposition process results in the formation of an epitaxial layer having a thickness of about 100 to 500 nanometers.

Figure 3:
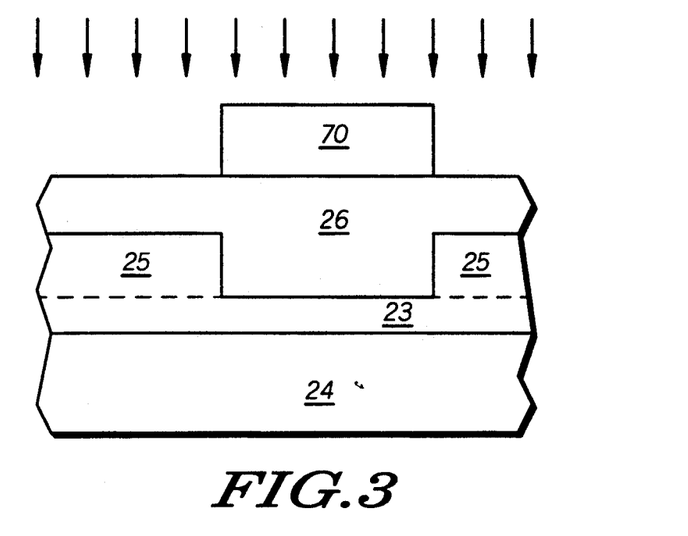

The fabrication of buried oxide layer 22 is completed by forming an implant mask 70 overlying first active device region 28 and performing a second SIMOX step, as shown in FIG. 3. Implant mask 70 is formulated from a material that can easily be removed from the surface of epitaxial layer 26. Implant mask 70 is preferably a dielectric material such as silicon oxide, silicon nitride, an oxynitride, and the like. To form implant mask 70 a photoresist material is exposed and developed to form the desired pattern and the underlying dielectric layer is etched to expose the portions of epitaxial layer 26 to be implanted. The second oxygen ion implantation is performed at a lower acceleration energy than the first oxygen implant and forms a second oxygenated region 25 in epitaxial layer 26 which extends from about 200 nanometers below the surface of epitaxial layer 26 to first oxygenated region 23.

Figure 4:
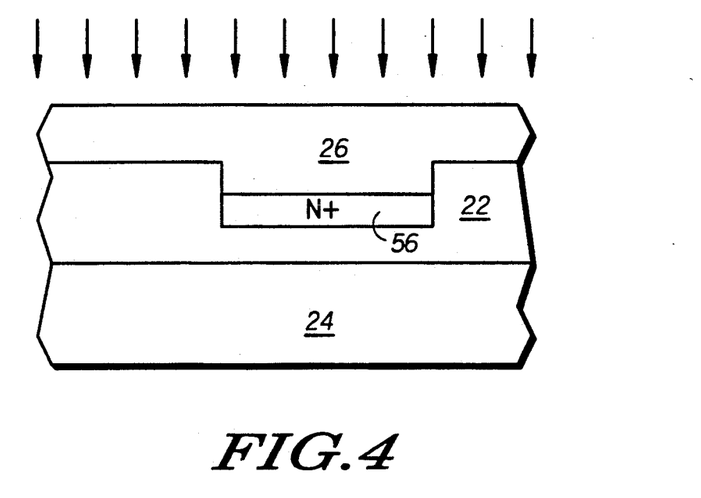

After buried oxide layer 22 has been formed, implant mask 70 is removed and an N-type dopant is implanted into substrate 24 to form buried collector 56, as shown in FIG. 4. An SOI substrate is thus realized having an epitaxial layer of varying thickness overlying a buried insulating layer. As illustrated in FIG. 1, the thick portion of epitaxial layer 26 provides an epitaxial body for the formation of vertical bipolar transistor 54 and the thin portion provides an epitaxial body for the formation of CMOS transistors 36 and 38.

Figure 5:
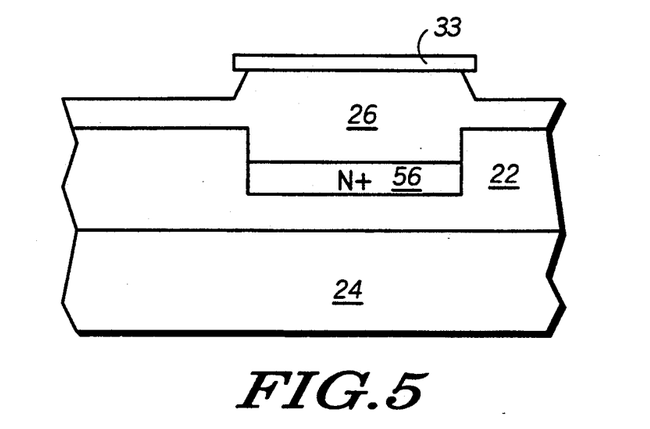

The SOI substrate shown in FIG. 4 can be fully utilized for the formation of a BiCMOS device according to the present invention, however, in some applications it is desirable to reduce the film thickness of the epitaxial layer in which the MOS transistors are to be formed and increase the film thickness overlying buried collector 56. For example, high speed MOS devices of the present invention can be readily fabricated in a thin epitaxial film overlying the buried insulating layer. The process can be optionally continued to adjust the relative thickness of first active device region 28 to second active device region 30. In one method, a pad oxide layer is formed to overlie the surface of epitaxial layer 26 then, photolithographically patterned and etched to form a portion 33 overlying first active device region 28 as shown in FIG. 5. The exposed portion of the thick epitaxial layer is then isotropically etched to reduce the thickness of first active device region 28 leaving a thicker epitaxial portion underlying oxide portion 33.

Figure 6:
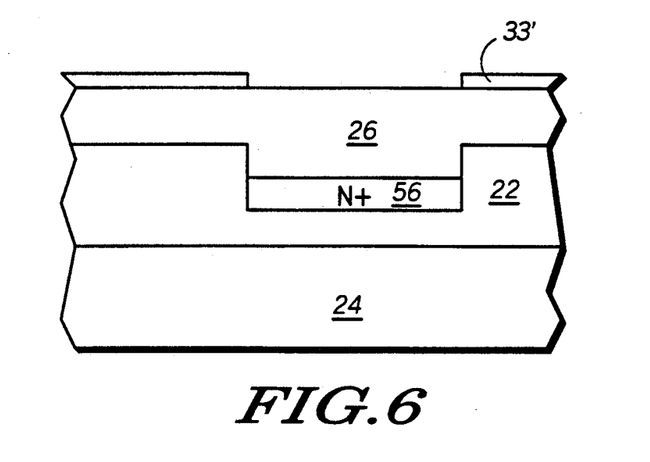
Figure 7:
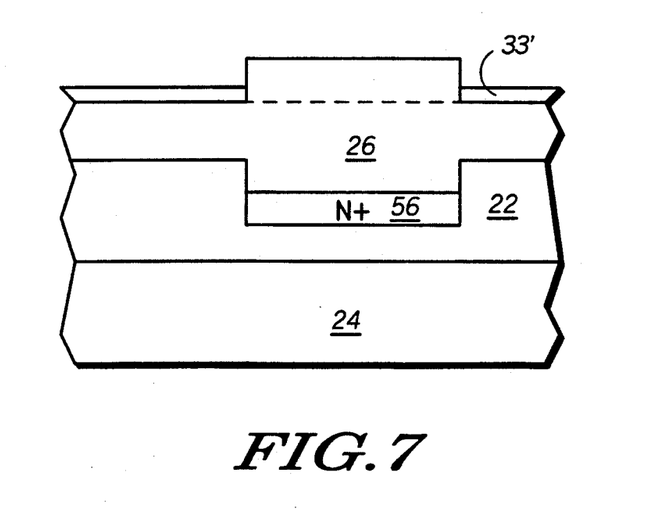

In another method, illustrated in FIGS. 6 and 7, the relative thickness of epitaxial layer 26 is adjusted by first forming a thin epitaxial layer overlying buried oxide layer 22. Next, a pad oxide layer is formed and patterned to leave a portion 33' which covers first active device region 28 but exposes second active device region 30. A selective epitaxial deposition process is then carried out to increase the thickness of the portion of the epitaxial layer overlying buried collector 56. In the selective deposition process, the deposition reaction is adjusted so that silicon is deposited only on the exposed surface of epitaxial layer 26 which acts as a nucleation site for the deposition. Once the selective deposition begins on a nucleation site, the selectively deposited silicon itself acts as a nucleation site so that the reaction continues depositing successive layers of silicon eventually forming a uniformly thick layer above the plane of oxide portion 33', as illustrated in FIG. 7. The selectively deposited epitaxial silicon does not otherwise deposit on oxides or other dielectric material and therefore only occurs on the surface of epitaxial layer 26 exposed by oxide portion 33'.

A particular advantage of the SOI substrate formed in accordance with the invention over BiCMOS bulk silicon substrates of the prior art is that a more planar surface topography is obtained. The formation of a substantial portion of the bipolar region below the principle surface of the substrate provides an ample volume of silicon in which to form a vertical bipolar transistor and decreases the height of the thick epitaxial region above the plane of the substrate. The reduced surface topographical contrast enables smaller geometrical features to be defined using conventional optical lithography.

PROCESS EMBODIMENT II

Figure 8:
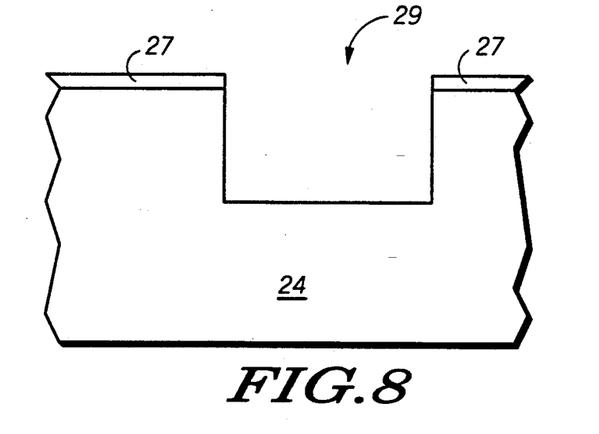
FIG. 8 through 11 illustrate, in cross section, process steps in accordance with a second embodiment for the fabrication of an SOI substrate.

In a second process embodiment, the SOI substrate is fabricated by first oxidizing substrate 24 to form a thin oxide layer 27, which is photolithographically patterned and etched to expose a surface portion of substrate 24. Next, the portion of substrate 24 exposed by patterned oxide layer 27 is anisotropically etched to form a recess 29 in substrate 24, as shown in FIG. 8. Anisotropic etching is an etch process usually carried out in a reactiveion-etch (RIE) reactor using a combination of etch gases and reactor conditions which result in more rapid etching of a material in the vertical direction than the horizontal direction. The directionality of the anisotropic RIE process results in the formation of structures having substantially vertical walls.

Figure 9:
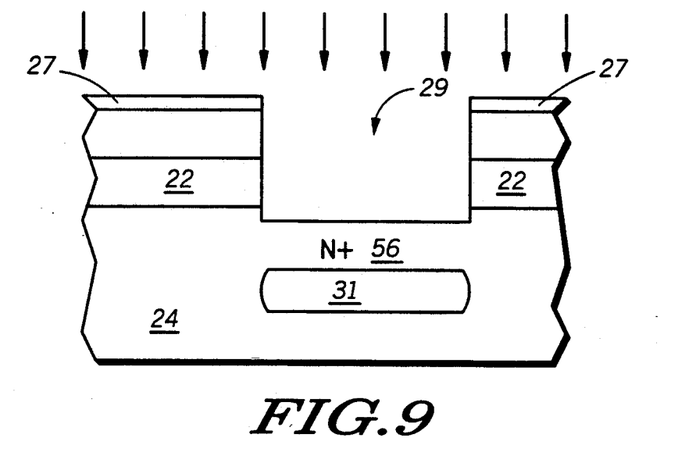

After recess 29 has been formed, the previously described SIMOX process is carried out to form buried oxide layer 22, as shown in FIG. 9. In this embodiment, because of the stepped topography created by recess 29, the implant process used to form buried oxide layer 22 also forms an oxide portion 31 below the surface of recess 29. An ion implantation step is then carried out to form N-type buried collector 56 in the portion of substrate 24 overlying oxide portion 31. Patterned oxide layer 27 prevents the N-type dopant from entering underlying portions of substrate 24.

Figure 10:
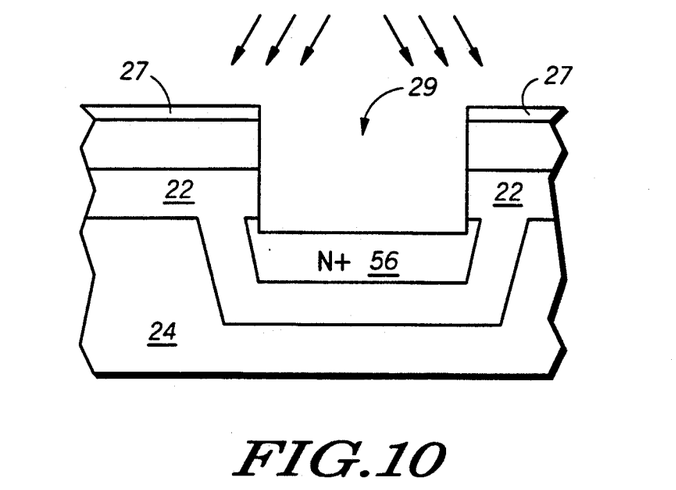

In an alternative SIMOX process, substrate 24 is tilted and axially rotated during the oxygen implantation in order to form a continuous buried oxide layer as shown in FIG. 10. The off-axis inclination of substrate 24, in conjunction with the axial rotation of substrate 24 during the implantation process, exposes the sides as well a the horizontal surface of recess 27 to the oxygen ion beam. The rotation and tilt of the substrate during the oxygen implant results in the formation of a continuous buried oxide layer below recess 29. Once buried oxide layer 22 is formed, an N-type dopant is implanted into portions of substrate 24 exposed by patterned oxide layer 27 to form buried collector 56.

Figure 11:
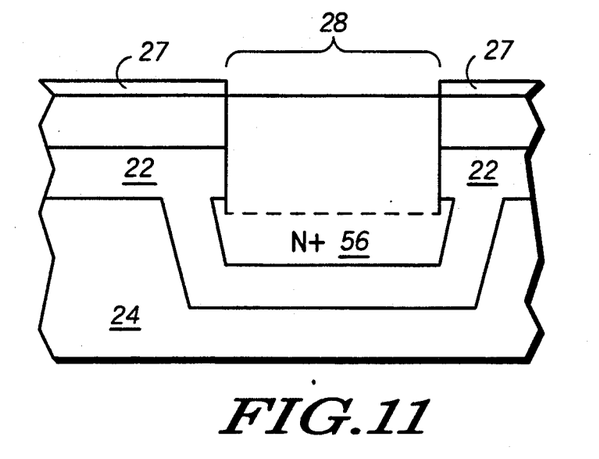

Following the formation of buried oxide layer 22 and buried collector 56, by either of the above described SIMOX methods, a selective deposition process is carried out to fill recess 29 with silicon, as illustrated in FIG. 11. The selective deposition reaction is adjusted so that silicon is deposited only on the exposed surface of recess 29 which acts as a nucleation site for the deposition. Successive layers of silicon are deposited substantially filling recess 29 resulting in the formation of second active device region 30 in recess 29.

PROCESS EMBODIMENT III

Figure 12:
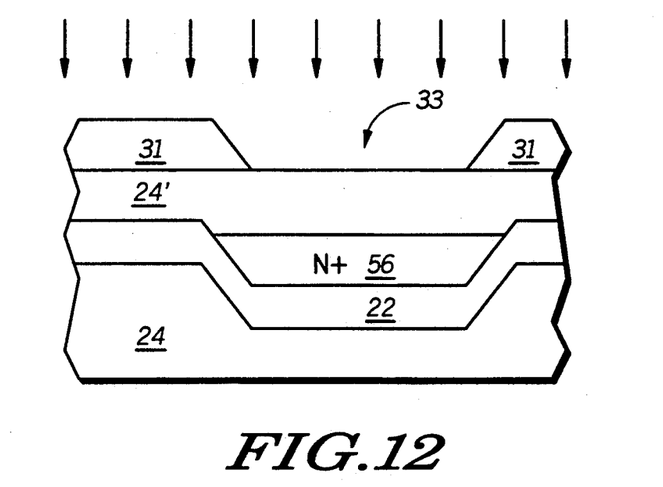
FIG. 12 through 13 illustrate, in cross section, process steps in accordance with a third embodiment for the fabrication of an SOI substrate.
Figure 13:
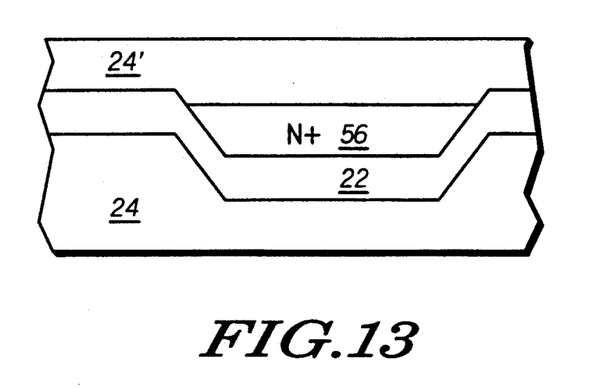

In a third process embodiment illustrated in FIG. 12, the SIMOX process includes using a thick masking oxide layer 31 on the surface of substrate 24 which is photolithographically patterned and taper etched to form an opening 33. The tapered etch process of the present invention is commonly used to form contact openings in dielectric layers having a gently sloping sidewall profile. In a similar manner the taper etch process used to form opening 33 produces an inclined wall surface on masking oxide layer 31. Preferably a downstream etch apparatus is used to isotropically etch masking oxide layer 31. A tapered edge profile in the underlying dielectric layer is obtained by using a reactive halogen gas plasma in the down-stream etcher. Alternatively, a controlled resist erosion process can be carried out using an RIE etch. The development of the photoresist is carried out to form a photoresist pattern having a tapered sidewall profile. The RIE etching conditions are adjusted such that the resist is eroded and the underlying oxide etched at approximately the same rate. In a further alternative method, a tapered etch profile in the underlying oxide layer is obtained using an isotropic wet chemical solution comprising buffered hydrofluoric acid. The inclined wall surface creates a continuous change in the oxide thickness overlying epitaxial layer 26 in the vicinity of opening 33. Since the oxygen ion blocking ability of the oxide layer concomitantly changes with changes in the oxide thickness, the oxide thickness variation directly attenuates the depth of the implanted oxygen ions below the surface of substrate 24. The depth of the buried oxide layer below the surface of epitaxial layer 26 is therefore controlled by the tapered edge of opening 33. The oxygen implant into epitaxial layer 26, using masking oxide layer 31 as an implant mask, enables the formation of a continuous buried oxide layer in substrate 24 underlying a surface portion 24' of substrate 24. Once buried oxide layer 22 is formed, masking oxide 31 is removed by a conventional wet chemical oxide etch, such as a hydrofluoric acid etch, resulting in the SOI substrate shown in FIG. 13. It should be noted that the process produces a planar substrate surface which improves the capability of optical lithography to define patterns having submicron feature size. Buried collector 56 is formed by the previously described ion implantation technique and can be formed either before or after removal of masking oxide layer 31.

Figure 14:
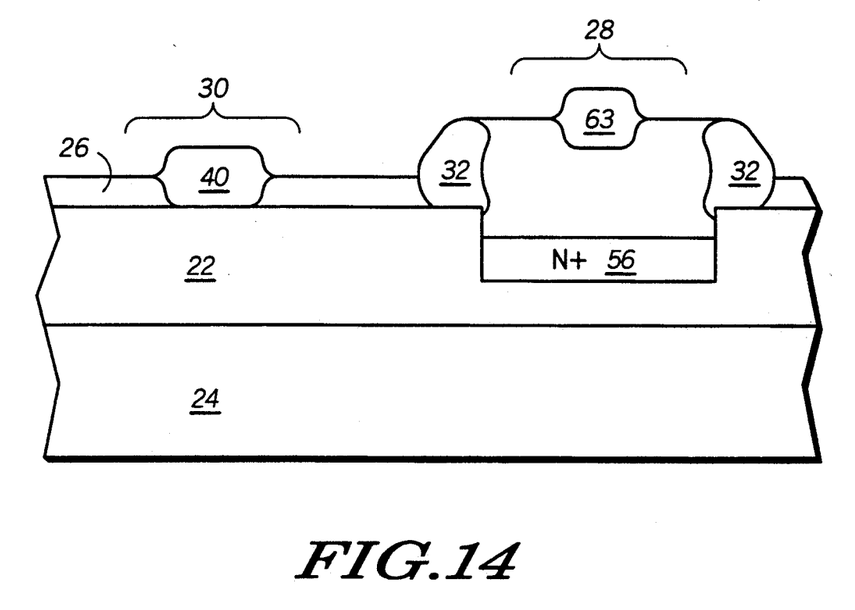
FIG. 14 illustrates, in cross section, an SOI substrate according to the invention having oxide isolation regions thereon.

The fabrication of active transistors in the SOI substrate formed in accordance with the invention will now be described. In one embodiment, isolation regions are formed to electrically isolate the active transistor regions from each other using a conventional LOCOS process. A silicon nitride layer is deposited to overlie epitaxial layer 26 and photolithographically patterned and etched to form an isolation pattern on the surface of epitaxial layer 26. An oxidation process is then carried out to form the oxide isolation regions and the patterned nitride layer is removed. The oxidation process forms isolation regions 32 and 63 in second active device region 30 and isolation region 40 in first active device region 28, as shown in FIG. 14. In the selective oxidation process, the formation of the isolation regions 32 and 40 completely consumes the underlying silicon resulting in a continuous oxide structure extending from the surface of epitaxial layer to buried oxide layer 22. The complete oxidation of a portion of epitaxial layer 26 in first active device region 28 effectively forms two electrically isolated portions. In a similar manner, isolation region 32 surrounding second active device region 30 also electrically isolates second active device region 30 from first active device region 28. Thus the oxidation process forms electrically isolated regions in epitaxial layer 26 which provide active device regions for the formation of transistors having opposite electrical conductivity.

Pursuant to the present invention, further conventional process steps are carried out to complete the fabrication of the BiCMOS device shown in FIG. 1. For example, transistor gate electrodes 46 and 52, and base electrode 64 are formed followed by a dielectric deposition to form interlevel dielectric layer 65. Collector contact 58 and N+ source and drain regions 42 and 44 are formed by ion implantation of an N-type dopant into epitaxial layer. Base region 60 and P+ source and drain regions 48 and 50 are formed by ion implanting a P-type dopant into epitaxial layer 26. Then, emitter electrode 66 and collector electrode 68 are formed and a thermal process is then carried out to form emitter region 62 by auto doping from emitter electrode 66.

Thus it is apparent that there has been provided, in accordance with the invention, a BiCMOS device on an SOI substrate which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different oxygen implant doses and energies can be used to form the buried oxide layer and different annealing methods, such as radiant or laser beam annealing, can be used to repair the oxygen implant damage and form the buried oxide layer. Furthermore, the MOS transistor can be fabricated to have a lightly-doped or double implanted drain structure. Additionally, a lateral biplor transistor can be formed in the first active device region. It is therefore intended to include within the invention all such variations and modifications as fall within the scope of the appended claims and equivalents thereof.

We claim:

1. A method for forming a semiconductor device on an SOI substrate comprising:
    providing a single crystal substrate;
    forming an SOI structure on the single crystal substrate, the SOI structure having a principal surface and having a buried oxide layer therein,
    wherein the SOI structure includes,
    a first SOI region in which the buried oxide layer is located a first distance from the principal surface, and
    a second SOI region in which the buried oxide layer is located a second distance from the principal surface;
    forming a first isolation region surrounding the second SOI region and electrically isolating the second SOI region from the first SOI region;
    forming a vertical bipolar transistor in the second SOI region;
    forming NMOS and PMOS transistors in the first SOI region; and
    forming a second isolation region in the first SOI region electrically isolating the NMOS transistor from the PMOS transistor.

2. The method of claim 1, wherein the step of forming an SOI structure further comprises:
    implanting oxygen atoms into the single crystal substrate to form a first portion of the buried oxide layer;
    annealing the substrate;
    depositing an epitaxial layer to overlie the substrate;
    forming an implant mask on the epitaxial layer protecting a portion of the epitaxial layer;

implanting oxygen atoms into the epitaxial layer using the implant mask to form a second portion of the buried oxide layer overlying a portion of the first portion of the buried oxide layer;

removing the implant mask; and forming a buried collector region in the protected portion of the epitaxial layer overlying the first buried oxide layer.

3. The method of claim 2 wherein the step of forming a buried collector region comprises implanting a dopant species into the epitaxial layer.

4. The method of claim 2 further comprising:

forming an oxide mask on the epitaxial layer overlying the second SOI region;

etching the epitaxial layer using the oxide mask as an etch mask to remove a portion of the epitaxial layer in the first SOI region; and removing the oxide mask.

5. The method of claim 2 further comprising:

forming an oxide mask on the epitaxial layer overlying a portion of the epitaxial layer in the first SOI region and exposing a portion of the epitaxial layer in the second SOI region; and selectively depositing a layer of silicon onto the exposed portion of the epitaxial layer.

6. The method of claim 1, wherein the step of forming an SOI structure further comprises:

forming an oxide mask overlying the surface of the single crystal substrate exposing a portion of the surface;

anisotropically etching a recess into the exposed portion of the single crystal substrate;

implanting oxygen atoms into the single crystal substrate to form the buried oxide layer;

forming a buried collector region in the single crystal substrate at the bottom of the recess extending into the single crystal substrate; and selectively depositing silicon to substantially fill the recess.

7. The method of claim 6, wherein the step of forming a buried collector region comprises implanting a dopant species into the single crystal substrate.

8. The method of claim 1, wherein the step of forming an SOI structure further comprises:

forming an oxide layer to overlie the single crystal substrate;

forming a photoresist pattern overlying the oxide layer and exposing a portion of the single crystal substrate;

etching the oxide layer using the photoresist pattern as an etch mask to form a patterned oxide layer having a tapered edge extending from the surface of the oxide layer to the surface of the single crystal substrate;

removing the photoresist pattern;

implanting oxygen atoms into the single crystal substrate using the patterned oxide layer as an implant mask to form the buried oxide layer wherein a portion of the buried oxide layer is removed from the surface of the single crystal substrate in areas of the single crystal substrate exposed by the patterned oxide layer;

implanting a conductivity determining dopant species into the single crystal substrate to form a buried collector region directly overlying the removed portion of the buried oxide layer; and etching away the patterned oxide layer.

9. The method of claim 8, wherein the step of forming an oxide layer comprises thermal oxidation of the single crystal substrate.

10. The method of claim 9, wherein the step of forming an oxide layer comprises chemical vapor deposition of silicon oxide.

* * * * *